US010529561B2

(12) United States Patent
Haider et al.

(10) Patent No.: US 10,529,561 B2
(45) Date of Patent: Jan. 7, 2020

(54) METHOD OF FABRICATING NON-ETCH GAS COOLED EPITAXIAL STACK FOR GROUP IIIA-N DEVICES

(71) Applicant: Texas Instruments Incorporated, Dallas, TX (US)

(72) Inventors: Asad Mahmood Haider, Plano, TX (US); Qhalid Fareed, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/981,348

(22) Filed: Dec. 28, 2015

(65) Prior Publication Data
US 2017/0186859 A1 Jun. 29, 2017

(51) Int. Cl.
*H01L 21/02* (2006.01)
*H01L 29/20* (2006.01)
*H01L 29/43* (2006.01)
*H01L 29/778* (2006.01)
*H01L 21/8252* (2006.01)
(Continued)

(52) U.S. Cl.
CPC ...... *H01L 21/0254* (2013.01); *H01L 21/0262* (2013.01); *H01L 21/02381* (2013.01); *H01L 21/02458* (2013.01); *H01L 21/02502* (2013.01); *H01L 21/8252* (2013.01); *H01L 27/0605* (2013.01); *H01L 27/085* (2013.01); *H01L 29/2003* (2013.01); *H01L 29/432* (2013.01);
(Continued)

(58) Field of Classification Search
CPC ......... H01L 21/02458; H01L 21/02502; H01L 21/0254; H01L 21/02584; H01L 29/205; H01L 29/2208; H01L 29/7784; H01L 29/66462
See application file for complete search history.

(56) References Cited

U.S. PATENT DOCUMENTS 6,218,280 B1 * 4/2001 Kryliouk ............... C30B 25/02
257/615
6,630,695 B2 10/2003 Chen et al.
(Continued)

OTHER PUBLICATIONS

H. Sasakai et al., "Investigation of Surface Pits Originating in Dislocations in AlGaN//GaN Epitaxial Layer Grown on Si Substrate with Buffer Layer", Japanese Journal of Applied Physics, vol. 45, No. 4A, 2006, pp. 2531-2533.
(Continued)

*Primary Examiner* — Michael Jung
(74) *Attorney, Agent, or Firm* — Jacqueline J. Garner; Charles A. Brill; Frank D. Cimino

(57) ABSTRACT

A method of fabricating an epitaxial stack for Group IIIA-N transistors includes depositing at least one Group IIIA-N buffer layer on a substrate in a deposition chamber of a deposition system. At least one Group IIIA-N cap layer is then deposited on the first Group IIIA-N buffer layer. During a cool down from the deposition temperature for the cap layer deposition the gas mixture supplied to the deposition chamber includes NH3 and at least one other gas, wherein the gas mixture provide an ambient in the deposition chamber that is non-etching with respect to the cap layer so that at a surface of the cap layer there is (i) a root mean square (rms) roughness of <10 Å and (ii) a pit density for pits greater than (>) 2 nm deep less than (<) 10 pits per square μm with an average pit diameter less than (<) 0.05 μm.

15 Claims, 3 Drawing Sheets

(51) Int. Cl.
*H01L 27/06* (2006.01)
*H01L 27/085* (2006.01)
*H01L 29/10* (2006.01)
*H01L 27/088* (2006.01)

(52) U.S. Cl.
CPC ...... *H01L 29/7786* (2013.01); *H01L 27/0883* (2013.01); *H01L 29/1066* (2013.01)

(56) References Cited

U.S. PATENT DOCUMENTS

| | | | |
|---|---|---|---|
| 2006/0261371 A1* | 11/2006 | Kuroda | H01L 21/0237 257/194 |
| 2007/0018198 A1* | 1/2007 | Brandes | H01L 29/7787 257/183 |
| 2007/0138505 A1* | 6/2007 | Preble | C30B 25/02 257/190 |
| 2010/0244087 A1* | 9/2010 | Horie | C30B 25/02 257/103 |
| 2011/0081771 A1 | 4/2011 | Su | |
| 2011/0108887 A1 | 5/2011 | Fareed et al. | |
| 2011/0169138 A1 | 7/2011 | Lin et al. | |
| 2012/0211759 A1* | 8/2012 | Liu | H01L 21/02381 257/76 |
| 2012/0223328 A1 | 9/2012 | Ikuta et al. | |
| 2012/0295418 A1* | 11/2012 | Melnik | H01L 21/0242 438/478 |
| 2013/0043442 A1 | 2/2013 | Konno et al. | |
| 2013/0134388 A1* | 5/2013 | Ueda | H01L 33/04 257/13 |
| 2014/0094223 A1 | 4/2014 | Dasgupta et al. | |
| 2015/0357419 A1 | 12/2015 | Lutgen et al. | |
| 2016/0268130 A1* | 9/2016 | Sugiyama | H01L 21/02381 |

OTHER PUBLICATIONS

European Patent Office Search Report, dated Jan. 2, 2019, PCT/US2016069051.

* cited by examiner

METHOD OF FABRICATING NON-ETCH GAS COOLED EPITAXIAL STACK FOR GROUP IIIA-N DEVICES

FIELD

Disclosed embodiments relate to Group IIIA-N (e.g., GaN) field effect transistors (FETs), and more particularly to buffer layers for such FETs.

BACKGROUND

Gallium-nitride (GaN) is a commonly used Group IIIA-N material, where Group IIIA elements such as Ga (as well as boron, aluminum, indium, and thallium) are also sometimes referred to as Group 13 elements. GaN is a binary IIIA/V direct bandgap semiconductor that has a Wurtzite crystal structure. Its relatively wide band gap of 3.4 eV at room temperature (vs. 1.1 eV for silicon) affords it special properties for a wide variety of applications in optoelectronics, as well as high-power and high-frequency electronic devices.

Because GaN and silicon have significant thermal expansion coefficient mismatches, buffer layer(s) are commonly used between the silicon substrate and the GaN layer for strain management. This buffer technology forms the basis of most GaN-on-Si technology commonly used for high-electron-mobility transistor (HEMT), also known as heterostructure FET (HFET) or modulation-doped FET (MODFET) devices, which are field-effect transistors incorporating a junction between two materials with different band gaps (i.e. a heterojunction) as the channel instead of a doped region (as is generally the case for a MOSFET). Some buffer arrangements for such devices use either super lattice structures or a graded buffer structure.

A GaN cap layer deposition follows the deposition of at least one buffer layer. Conventional buffer layer and cap layer deposition processes utilize $NH_3$ and $H_2$ during the cool down from their respective deposition temperatures. The $H_2$ volume flow rate is generally several times the $NH_3$ volume flow rate.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize that the conventional $NH_3$ and $H_2$ gas mixture supplied to the deposition chamber during the cool down after epitaxial Group IIIA-N cap layer depositions for Group IIIA-N devices results in pits in the cap layer upon the cooling, that can be worsened after subsequent etching/cleaning where preferential etching can take place. It was discovered that $H_2$ can attack Group IIIA-N cap layers such as GaN or AlGaN causing pits. Defects in the cap layer such as pits results in defects in the power transistor and if in a high enough density can result in device failures.

Disclosed cap layer depositions follow the deposition of at least one buffer layer on a substrate with a cooling process that utilizes a supplied gas mixture including NH3 and at least one other gas, where the gas mixture provides an ambient in the deposition chamber that is non-etching with respect to the first Group IIIA-N layer. As used herein "non-etching" refers a resulting surface of the cap layer having a (i) a root mean square (rms) roughness of <10 Å and (ii) a pit density for pits layer greater than (>) 2 nm deep less than (<) 10 pits per square µm with an average pit diameter less than (<) 0.05 µm. One particular embodiment utilizes a gas mixture during cooldown with only NH3 and N2.

BRIEF DESCRIPTION OF THE DRAWINGS

Reference will now be made to the accompanying drawings, which are not necessarily drawn to scale, wherein.

DETAILED DESCRIPTION

Figure 1:
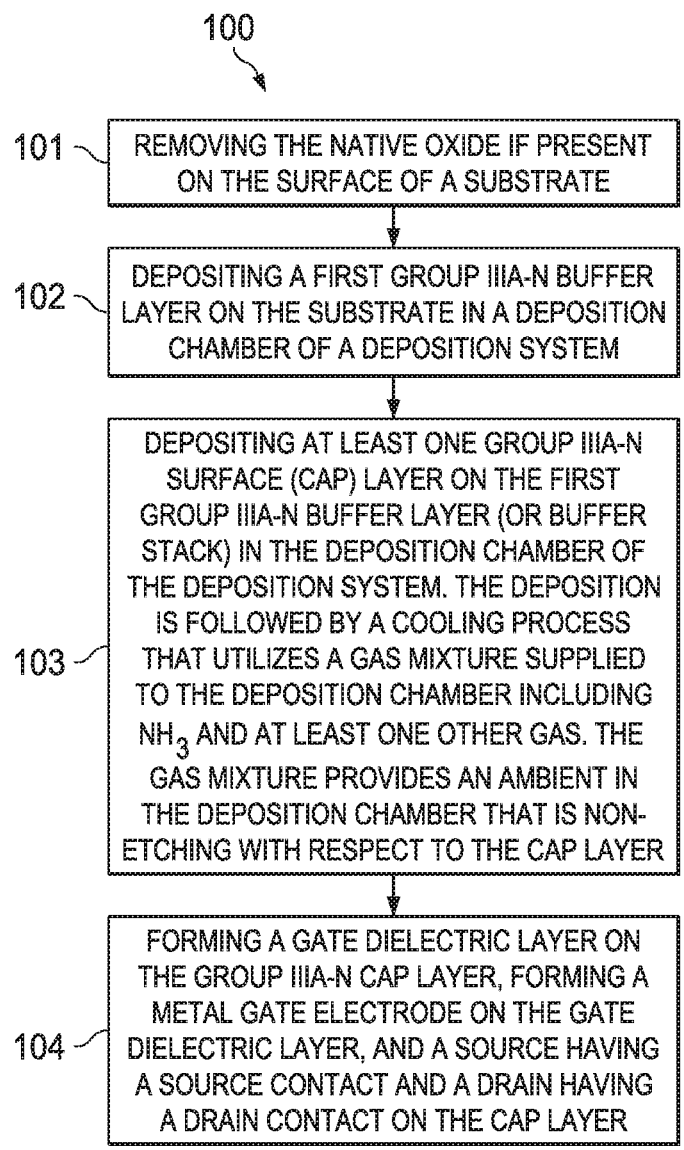
FIG. 1 is a flow chart that shows steps in an example method of fabricating an epitaxial layer stack including at least one low defect density cap layer for a power group IIIA-N transistor, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 of fabricating an epitaxial layer stack including a low defect density cap layer for a Group IIIA-N power transistor, according to an example embodiment. All respective buffer and Group IIIA-N cap layers can be epitaxially deposited in a single run using a metal-organic chemical vapor deposition (MOCVD) system, molecular beam epitaxy (MBE) system, or hydride vapor phase epitaxy (HVPE) system.

Step 101 comprises removing the native oxide if present on the surface of the substrate (e.g., wafer). The substrate can comprise sapphire, silicon or silicon carbide (SiC).

Step 102 comprises depositing at least a first Group IIIA-N buffer layer on the substrate in a deposition chamber of a deposition system, using a deposition temperature generally from 1050° C. to 1300° C. The buffer layer(s) can be 1 micron to 10 microns thick. The Group IIIA-N buffer layer(s) and cap layers disclosed herein may be represented by the general formula $Al_xGa_yIn_{1-x-y}N$, where $0<x\leq1$, $0\leq y\leq1$, $0<x+y\leq1$. For example, the Group IIIA-N layer can comprise at least one of AlN, AlGaN, AlInN, and AlInGaN. Other Group IIIA elements such as boron (B) may be included, and N may be partially replaced by phosphorus (P), arsenic (As), or antimony (Sb). Each of the Group IIIA nitride compound semiconductors may contain an optional dopant selected from Si, C, Ge, Se, O, Fe, Mn, Mg, Ca, Be, Cd, and Zn.

The buffer layer deposition(s) can optionally be followed by a disclosed cooling process cooling from the higher buffer layer deposition temperature (e.g., 1250° C.) to the lower deposition temperature of the cap layer deposition, such as 900° C. to 1050° C., that utilizes a gas mixture supplied to the deposition chamber including $NH_3$ and at least one other gas, where the gas mixture provides an ambient in the deposition chamber that is non-etching with respect to the first Group IIIA-N buffer layer. The ramp down rate during this cooling process is generally 5° C./min to 40° C./min. The other gas can be $N_2$, Ar, He, Ne, Kr and or a combination of such gases. In one particular embodiment $NH_3$ is supplied at 2 to 20 liters/min and $N_2$ is supplied at 50 to 150 liters/min. Hydrogen ($H_2$) may be provided up to about 40% by volume $H_2$ provided the mixture remains non-etching.

Following step 102 the method can comprise optionally depositing at least a second Group IIIA-N buffer layer on the first Group IIIA-N buffer layer to form a buffer stack. The other buffer layer deposition step(s) can use the same process low defect density deposition process as step 102 described above including the disclosed cooling process.

Step 103 comprises depositing at least one Group IIIA-N cap layer on the first Group IIIA-N buffer layer (or buffer stack). As noted above, the cap layer deposition temperature is generally from 900° C. to 1050° C.

The cap layer deposition is followed by a cooling process from the deposition temperature to a temperature generally from 300° C. to 550° C. that utilizes a gas mixture including NH3 and at least one other gas, where the gas mixture provides an ambient in the deposition chamber that is non-etching with respect to the cap layer. As described above, "non-etching" here refers to a resulting cap layer having (i) a root mean square (rms) roughness of <10 Å and (ii) a pit density for pits layer greater than (>) 2 nm deep less than (<) 10 pits per square μm with an average pit diameter less than (<) 0.05 μm. Surface roughness may be measured by an atomic force microscopy (AFM) system, while the pit density may be measured by a defect analysis tool such as the KLA-Tencor CANDELA® 8620 Inspection System.

The other gas can be $N_2$, Ar, He, Ne, Kr and or a combination of such gases. In one particular embodiment $NH_3$ is supplied at 2 to 20 liters/min and $N_2$ is supplied at 50 to 150 liters/min. Hydrogen ($H_2$) may be provided up to about 40% by volume $H_2$ provided the mixture remains non-etching. The ramp down rate during this cooling process is generally 5° C./min to 40° C./min, and as described above can cool down to a temperature of 300° C. to 550° C., where the deposition chamber is vented to atmosphere and the boat of wafers is then generally removed from the deposition chamber.

Step 104 comprises forming a gate dielectric layer (e.g., SiN, SiON, $Al_2O_3$, AlN, silicon oxide or combination of any of these layers) on the cap layer, forming a metal gate electrode on the gate dielectric layer, and a source having a source contact and a drain having a drain contact on the cap layer. The gate electrode can comprise a TiW alloy in one embodiment. The source and drain can be formed by sputtering a metal stack such as Ti/Al/TiN in one particular embodiment.

Figure 2:
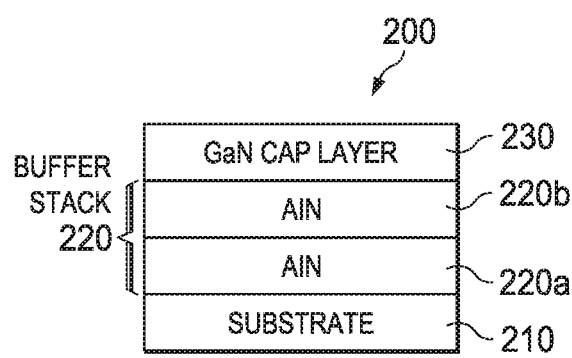
FIG. 2 is a cross sectional depiction of an example device stack that includes a Group IIIA-N buffer layer with a disclosed low defect density cap layer thereon, according to an example embodiment.

FIG. 2 is a cross sectional depiction of an example device stack 200 that includes a multi-layer buffer stack (buffer layer stack) 220 comprising a first Group IIIA-N buffer layer 220a and a second group IIIA-N buffer layer 220b both shown as AlN layers on a substrate (e.g., silicon) 210, according to an example embodiment. A Group IIIA-N cap layer 230 shown as a GaN layer is on the second Group IIIA-N buffer layer 220b, where the Group IIIA-N cap layer 230 has a low defect density formed using a disclosed cap layer cool down process using an ambient in the deposition chamber during cooling that is non-etching with respect to the cap layer. In another arrangement the first Group IIIA-N buffer layer 220a comprises AlN, the second group IIIA-N buffer layer 220b comprises GaN, and the Group IIIA-N cap layer 230 comprises AlGaN. Example thickness ranges for the Group IIIA-N cap layer 230 can be 5 Å to 300 Å which can be used as a HEMT layer, 50 Å to 300 Å for the second Group IIIA-N buffer layer 220b, and 0.1 μm to 5 μm for the first Group IIIA-N buffer layer 220a.

Advantages of disclosed embodiments include the ability to deposit an essentially void and crack-free epitaxial GaN film stack including an essentially void and crack-free cap layer to enable obtaining higher transistor breakdown voltage, lower leakage current, and reduced substrate bow/warp. For example, disclosed power transistors can provide a breakdown voltage of at least of 100V at a leakage current density of 1 μamp per $mm^2$.

Examples of power semiconductor devices that can utilize disclosed epitaxial stacks include HEMT, double heterostructure field effect transistors (DHFETs), heterojunction bipolar transistors (HBTs) and bipolar junction transistors (BJTs). A HEMT, also known as heterostructure FET (HFET) or modulation-doped FET (MODFET), is a field-effect transistor incorporating a junction between two semiconductor materials with different band gaps (i.e. a heterojunction) as the two dimensional electron gas (2DEG) channel layer instead of a doped region (as is generally the case for a metal-oxide-semiconductor field-effect transistor (MOSFET)). The HEMT includes a compound semiconductor having a wide band gap such as GaN and AlGaN. Due to high electron saturation velocity in GaN and IIIA-N materials systems, the electron mobility in GaN HEMT is higher than that of other general transistors such as Metal Oxide Semiconductor Field Effect Transistors (MOSFETs).

Figure 3A:
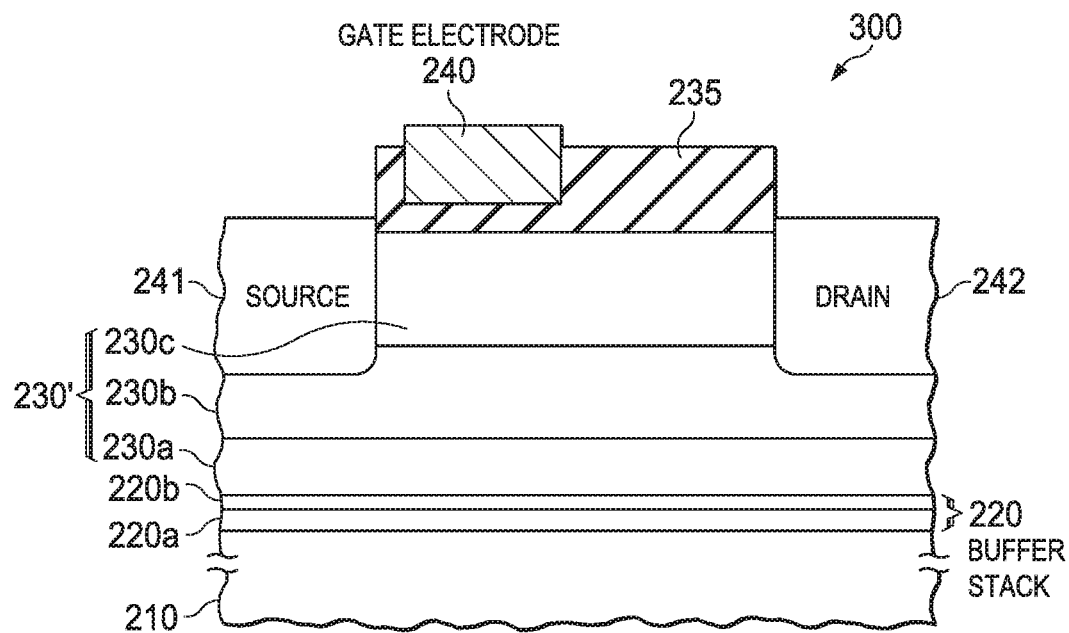
FIG. 3A is a cross sectional view of an example depletion-mode high-electron-mobility transistor (HEMT) with a disclosed epitaxial layer stack having a low defect density cap layer, according to an example embodiment.

FIG. 3A is a cross sectional view of an example depletion-mode HEMT power device 300 with a disclosed epitaxial stack shown including a Group IIIA-N cap layer 230' on a buffer layer stack 220 on a substrate 210, according to an example embodiment. HEMT power device 300 is shown having a gate dielectric layer 235 such as comprising silicon nitride or silicon oxynitride. The Group IIIA-N cap layer 230' is a low defect density cap layer, with a surface of the Group IIIA-N cap layer 230' having (i) a root mean square (rms) roughness of <10 Å and (ii) a pit density for pits layer greater than (>) 2 nm deep less than (<) 10 pits per square μm with an average pit diameter less than (<) 0.05 μm. In this embodiment the Group IIIA-N cap layer 230' can comprise an AlGaN layer 230b sandwiched between a topmost (first) GaN layer 230c and bottommost (second) GaN layer 230a that is on the second Group IIIA-N buffer layer 220b. The topmost and bottommost GaN layers 230c, 230a generally each have a doping concentration between $1 \times 10^{15}$ cm-3 and $1 \times 10^{18}$ cm-3. The dopants can include carbon, magnesium, silicon, or zinc, or combination of such dopants.

HEMT power device 300 can be a discrete device, or one of many devices on an IC. More generally, the Group IIIA-N cap layer 230' may include one or more of GaN, InN, AlN, AlGaN, AlInN, InGaN, and AlInGaN. As noted above the Group IIIA-N layers can include other Group IIIA elements such as B, and N may be partially replaced by P, As, or Sb, and may also contain an optional dopant. In another specific example, the Group IIIA-N cap layer 230' can comprise a GaN layer on top of an $Al_xGa_yN$ layer or an $In_xAl_yN$ layer. Yet another specific example is the Group IIIA-N cap layer 230' being a tri-layer stack can comprise GaN on InAlN on AlGaN.

HEMT power device 300 includes a source 241, a drain 242, and a gate electrode 240. Gate electrode 240 is positioned between the source 241 and drain 242, closer to the source 241 than the drain 242. The source 241, drain 242, and gate electrode 240 may be formed of metals and/or metal nitrides, but example embodiments are not limited thereto.

Figure 3B:
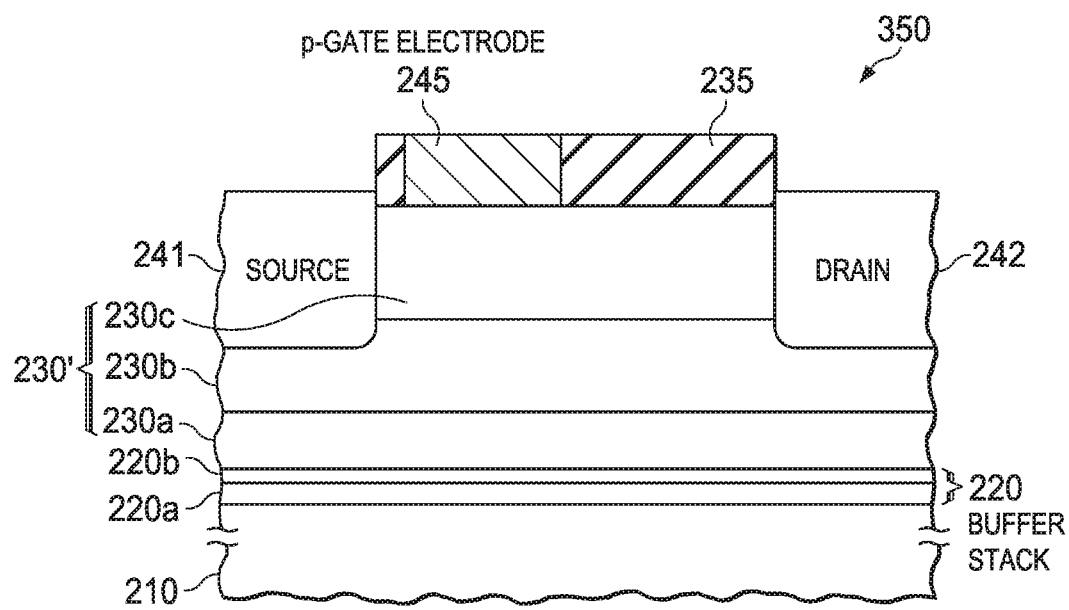
FIG. 3B is a cross sectional view of an example enhancement-mode HEMT with a normally off gate with a disclosed epitaxial layer stack having a low defect density cap layer, according to an example embodiment.
Figure 3C:
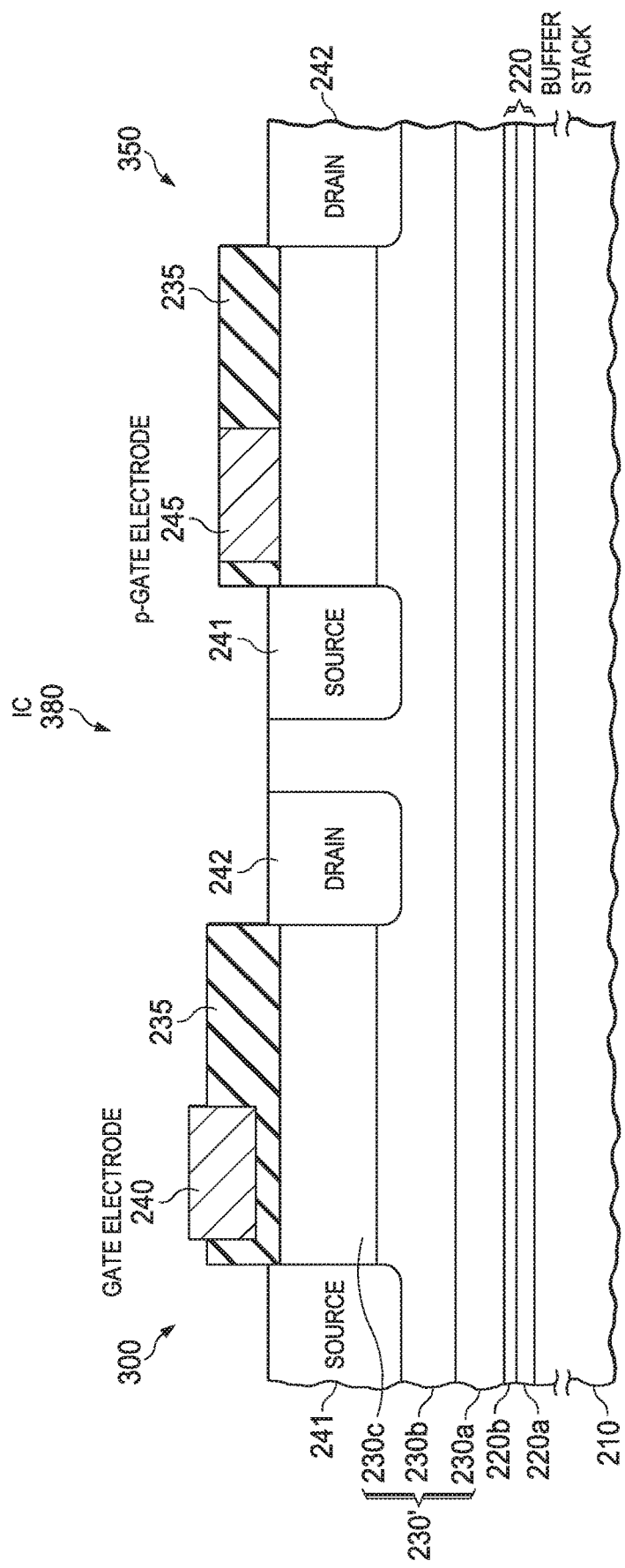
FIG. 3C is a cross sectional view of an example IC including the depletion mode HEMT power device shown in FIG. 3A and the enhancement-mode HEMT shown in FIG. 3B both on the same low defect density cap layers on a buffer stack.

FIG. 3B is a cross sectional view of an example enhancement-mode HEMT power device 350 with a normally off gate with a disclosed Group IIIA-N cap layer 230' on a buffer layer shown as a buffer layer stack 220 on a substrate 210, according to an example embodiment. The Group IIIA-N cap layer 230' is a low defect density cap layer, with a surface of the Group IIIA-N cap layer 230' having (i) a root mean square (rms) roughness of <10 Å and (ii) a pit density for pits layer greater than (>) 2 nm deep less than (<) 10 pits per square μm with an average pit diameter less than (<) 0.05 μm. In this embodiment, the gate electrode is a p-doped gate electrode 245 (shown as a p-GATE ELECTRODE) that is in direct contact with the Group IIIA-N cap layer 230c (e.g., GaN layer). FIG. 3C is a cross sectional view of an example IC 380 including the depletion mode HEMT power device 300 shown in FIG. 3A and the enhancement-mode HEMT shown in FIG. 3B both using the same cap layers and buffer stack.

EXAMPLES

Disclosed embodiments are further illustrated by the following specific Examples, which should not be construed as limiting the scope or content of this Disclosure in any way.

AFM data was taken for a disclosed cap layer on a Si substrate formed using a disclosed $NH_3/N_2$ cap layer cooldown as compared to a known cap layer formed using a $NH_3/H_2$ gas mixture for the cap layer cooldown. In one example, the $NH_3/N_2$ flow ratios are 1:10 with flow ranging from 2 to 20 liters/min of $NH_3$ and $N_2$ in the range of 50 to 150 liters/min. As deposited, the wafers processed with the disclosed $NH_3/N_2$ cap layer cool down consistently showed no surface pits with data from wafers from several different runs. In contrast, the wafers processed with the known $NH_3/H_2$ cap layer cool down consistently showed surface pits $1\times10^{10}$ per $cm^2$ with sizes ranging from 10 nm to 200 nm with data taken from wafers from several different runs.

It was also found pits in the cap layer can be worsened after subsequent etching/cleaning where preferential etching at the defect sites was found to take place. Wafers with cap layers from a disclosed $NH_3/N_2$ cooled cap layer process and a known cap layer formed using a $N_2/H_2$ gas mixture for the cap layer cooldown were submitted for two sets of cleaning process. AFM analysis was performed on wafers for both cap layer processes. For wafers with a cap layer from a disclosed $NH_3/N_2$ cooled cap layer the depth of the pits as deposited were at about 0.7 nm to 1 nm, which remained at about 0.7 nm to 1 nm deep after the two sets of cleaning processes. For wafers with a cap layer from the known $NH_3/H_2$ cooled process the depth of the pits as deposited were at about 1 nm to 3 nm, which increased to 6 nm to 10 nm deep after the two sets of cleaning processes.

High-temperature-reverse-bias (HTRB) HEMT device data was obtained where the cap layer comprised GaN and the buffer layer comprised AlGaN formed using a disclosed $N_2/NH_3$ cap layer cooldown along with control GaN cap layer formed using a known $NH_3/H_2$ cap layer cooldown.

HTRB failures were associated with reliability fails due to GaN cap layer pits. HEMTs having a control GaN cap layer formed using a known $N_2/H_2$ cap layer cooldown had a burn-in failure rate of 5% to 10%, while HEMTs having a disclosed GaN cap layer formed using a disclosed $NH_3/N_2$ cap layer cool down had a failure rate of <2% HTRB fails.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of fabricating a Group IIIA-N transistor, comprising:

depositing at least a first Group IIIA-N buffer layer on a substrate in a deposition chamber of a deposition system at a first temperature;

depositing at least one Group IIIA-N surface cap layer on said first Group IIIA-N buffer layer in said deposition chamber of said deposition system at a second temperature less than or equal to the first temperature, followed by cooling the substrate 550° C. or less using a cooling process that provides a gas mixture to said deposition chamber continuously to a cool down temperature at which the deposition chamber is vented, the gas mixture including $NH_3$ and at least one other gas including no more than 40% $H_2$ by volume, wherein the cooling process using $NH_3$ and at least one other gas continues to a cool down temperature where the deposition chamber is vented and wherein said gas mixture provides an ambient in said deposition chamber that is non-etching with respect to the cap layer so that at a surface of said cap layer there is (i) a root mean square (rms) roughness of <10 Å and (ii) a pit density for pits greater than 2 nm deep less than 10 pits per square μm with an average pit diameter less than 0.05 μm;

forming a gate dielectric layer on said Group IIIA-N surface cap layer;

forming a metal gate electrode on said gate dielectric layer; and forming a source having a source contact to said Group IIIA-N surface cap layer and a drain having a drain contact to said Group IIIA-N surface cap layer.

2. The method of claim 1, further comprising using the cooling process while cooling the substrate from the first temperature to a cap layer deposition temperature after depositing said first Group IIIA-N buffer layer is before said depositing said Group IIIA-N cap layer.

3. The method of claim 1, wherein said deposition system comprises a metal-organic chemical vapor deposition (MOCVD) system, molecular beam epitaxy (MBE) system, or a hydride vapor phase epitaxy (HVPE) system.

4. The method of claim 1, wherein a thickness of said Group IIIA-N cap layer is in a range between 3 nm and 50 nm.

5. The method of claim 1, wherein said first Group IIIA-N buffer layer and said Group IIIA-N surface cap layer both comprise GaN or AlGaN.

6. The method of claim 1, wherein said substrate comprises sapphire, silicon, or silicon carbide (SiC).

7. The method of claim 1, wherein said gas mixture consists of $N_2$ and $NH_3$.

8. The method of claim 1, wherein said gas mixture is free of $H_2$.

9. A method of fabricating a Group IIIA-N transistor, comprising:
    depositing a Group IIIA-N buffer layer on a substrate in a deposition chamber of a deposition system at a first temperature, and
    cooling the substrate to a temperature less than or equal to the first temperature using a gas mixture that includes $NH_3$ and at least one other gas such that an ambient in said deposition chamber is non-etching with respect to the Group IIIA-N buffer layer; and
    depositing a Group IIIA-N cap layer on said first Group IIIA-N buffer layer in said deposition chamber of said deposition system, followed by a cooling process to less than or equal to 550° C. until the deposition chamber is vented, the cooling process utilizing a gas mixture supplied to said deposition chamber including $NH_3$ and $N_2$;
    forming a gate dielectric layer on said Group IIIA-N surface cap layer;
    forming a metal gate electrode on said gate dielectric layer; and
    forming a source having a source contact to said Group IIIA-N surface cap layer and a drain having a drain contact to said Group IIIA-N surface cap layer.

10. The method of claim 9, wherein said deposition system comprises a metal-organic chemical vapor deposition (MOCVD) system, molecular beam epitaxy (MBE) system, or a hydride vapor phase epitaxy (HVPE) system.

11. The method of claim 9, wherein a thickness of said Group IIIA-N cap layer is 3 nm to 50 nm.

12. The method of claim 9, wherein said substrate is a silicon substrate.

13. A method of fabricating a Group IIIA-N transistor, comprising:
    depositing at least a first Group IIIA-N buffer layer on a substrate in a deposition chamber of a deposition system at a first temperature;
    depositing at least one Group IIIA-N surface cap layer on said first Group IIIA-N buffer layer in said deposition chamber of said deposition system at a second temperature less than or equal to the first temperature, followed by cooling the substrate 550° C. or less using a cooling process that provides a gas mixture to said deposition chamber continuously to a cool down temperature at which the deposition chamber is vented, the gas mixture including $NH_3$ and at least one other gas including no more than 40% $H_2$ by volume;
    forming a gate dielectric layer on said Group IIIA-N surface cap layer;
    forming a metal gate electrode on said gate dielectric layer; and
    forming a source having a source contact to said Group IIIA-N surface cap layer and a drain having a drain contact with said Group IIIA-N surface cap layer.

14. The method of claim 13, wherein said gas mixture provides an ambient in said deposition chamber that is non-etching with respect to the cap layer so that at a surface of said cap layer there is (i) a root mean square (rms) roughness of less than 1 nm and (ii) a pit density for pits greater than 2 nm deep less than 10 pits per square μm with an average pit diameter less than 0.05 μm.

15. The method of claim 13, wherein said gas mixture is free of $H_2$.

* * * * *